(12) United States Patent
Lu et al.

(10) Patent No.: US 6,552,361 B1
(45) Date of Patent: Apr. 22, 2003

(54) THIN FILM TRANSISTOR DEVICE

(75) Inventors: I-Min Lu, Taipei (TW); Jr-Hong Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 67 days.

(21) Appl. No.: 09/680,935

(22) Filed: Oct. 10, 2000

(51) Int. Cl.$^7$ .................. H01L 29/04; H01L 29/76; H01L 31/036; H01L 27/01

(52) U.S. Cl. .................. 257/59; 257/66; 257/72; 257/347

(58) Field of Search .................. 257/59, 66, 72, 257/347, 642, 643

(56) References Cited

U.S. PATENT DOCUMENTS 6,100,954 A * 8/2000 Kim et al. .................. 25/59

FOREIGN PATENT DOCUMENTS

JP          11-125831     * 5/1999   .................. 257/72

* cited by examiner

Primary Examiner—Steven Loke
(74) Attorney, Agent, or Firm—Rabin & Berdo, P.C.

(57) ABSTRACT

A thin film transistor (TFT) and method of fabricating the same. A planarization layer of polymer is formed on the interlayer to reduce short-circuit. The planarization layer further reduces the capacitance of the crossover capacitor and the delay time of the LCD panel using the TFT is therefor minimized. A gate thereof can be design under the data line to increase aperture ratio.

13 Claims, 4 Drawing Sheets

THIN FILM TRANSISTOR DEVICE

BACKGROUND OF THE INVENTION

This application incorporates by reference Taiwanese application Ser. No. 89109389, Filed on May 11, 2000.

1. Field of the Invention

The invention relates in general to the structure and the manufacturing method of a thin film transistor (TFT), and more particularly to a structure and a manufacturing method of a thin film transistor device, which reduces short-circuiting between different metal layers.

2. Description of the Related Art

Liquid Crystal Displays (LCDs) are turning up everywhere these days. The LCD, a light, slender display, with a beautiful image that does not tire the eyes even when viewed for hours at a time, is finding its way into many products.

Specific applications with significant growth potential for LCD, include portable computers, desktop computers, audio visual equipment.

The Super-Twisted Nematic mode LCD (STN LCD) and Thin Film Transistor LCD (TFT LCD) are the two popular types of LCDs nowadays. They are usually applied in different devices. Due to the wide viewing angle of the TFT LCD, the TFT LCD is more widely incorporated.

FIG. 1 shows the equivalent circuit of the LCD panel. For the purpose of clearly illustrating, only 3 scan lines 101 and 3 data lines are shown herein. However, it is apparent that the real LCD panel includes more than that.

As shown in FIG. 1, there is a crossover capacitor 103 at the crossover of each scan line 101 and data line 102. The crossover capacitor determines the delay time of the LCD panel. Larger capacitance of the crossover capacitor causes a longer delay time. On the other hand, lower capacitance of the crossover capacitor causes a shorter delay time.

FIG. 2 is the cross-sectional view of the crossover capacitor of a conventional TFT. The crossover capacitor region 200 is composed of a scan line layer 201, an interlayer 202 and a data line 203. The scan line layer 201 and the data line layer 203 are both metal layers. As it can be inferred from the names, the scan line layer 201 and the data line layer 203 in FIG. 2 respectively form the scan line and data line in FIG. 1. The scan line layer 201 can be, for example, the gate of the TFT. The source region and drain region thereof can be easily inferred and therefore are omitted in FIG. 2.

The manufacturing methods of the interlayer 202 include at least the following:

1. depositing silicon oxide (SiOx) and performing hydrogen plasma hydrogenation; and
2. depositing silicon nitride (SiNx) by PECVD and high temperature annealing.

During the fabrication of the TFT, the problem of short-circuiting should be overcome, in addition to meeting other basic requirements of the device property like the follow of current and the value of threshold voltage. A short-circuit between two different metal layers causes heavy loading of the system during driving, which therefore interrupts the normal procedure.

FIG. 3 is a cross-sectional view of a crossover capacitor region, having pin holes, of a conventional TFT The crossover capacitor region 300 includes a scan line layer 301, an interlayer 302 and a data line layer 303. The chief defect of the TFT in FIG. 3 is the pin holes 304, which are formed at the edge of the scan line layer 301 during the formation of the interlayer 302. The pine holes 304 could be filled with the material of the data line layer 303 in the following procedure of fabricating the data line layer 303. Consequently, the data line layer 303 is connected with the scan line layer 301. Due to the fact that the materials of the data line layer 303 and the scan line layer are both conductors, the connection of the data line layer 303 and the scan line layer 301 results in a short-circuit in the crossover capacitor region 300.

Conventionally, the edges of the lower metal layer, the scan line layer in this case, are etched to be taper-shaped to reduce the occurrence of short-circuit between different metal layers.

FIG. 4 is the cross-sectional view, showing the conventional method to modify the TFT in order to eliminate short-circuiting. The crossover capacitor region as in FIG. 4 includes a scan line layer 401, an interlayer 402 and a data line layer 403. The edges of the scan line layer 401 are etched to be taper-shaped. Therefore, the interlayer 401 formed thereafter could have better step coverage, which consequently reduces the occurrence of the pin holes and short-circuits. It is clear that this method include at least one additional step to etch the lower metal layer, which conflicts the principle of minimizing fabricating steps.

Another method for preventing pin holes is to improve the pre-washing procedure before the deposition of the interlayer. However, to improve the pre-washing procedure requires high-stability of each step, which therefore increases the complexity the process.

SUMMARY OF THE INVENTION

It is therefore an object of the invention to provide an improved and simplified structure and process of forming a TFT, to solve the above-mentioned problems. According to a preferred embodiment of the invention, the lower metal line (the scan line layer) needs not to be etched so as to be taper-like. Also, pre-washing under strict control is not needed. Furthermore, the TFT device of a preferred embodiment of the invention has a higher yield and the percentage of devices formed with short-circuits is greatly reduced.

It is another object of the invention to provide a TFT and a method of forming the same. A planarization layer of polymer is formed on the interlayer to reduce short-circuiting. The planarization layer further reduces the capacitance of the crossover capacitor, and the delay time of the LCD panel using the TFT is therefore minimized. A gate thereof can be designed to be under the data line to increase the aperture ratio.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
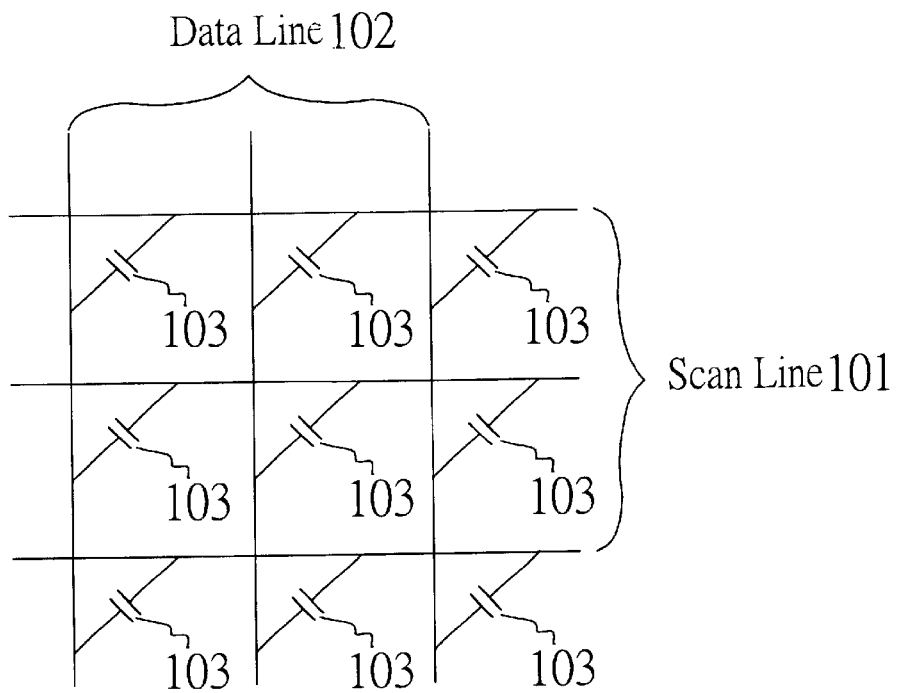
FIG. 1 (Prior Art) illustrates the equivalent circuit of the LCD panel.
Figure 2:
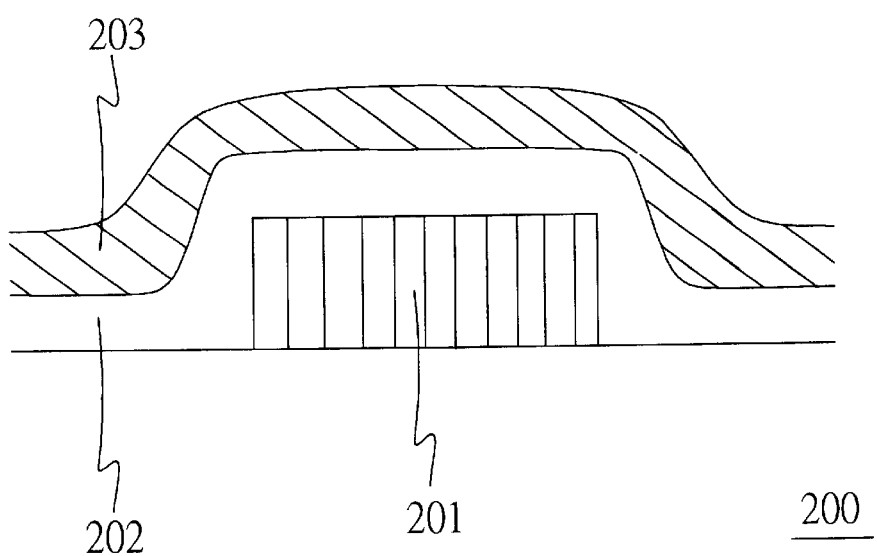
FIG. 2 (Prior Art) is a cross-sectional view of the crossover capacitor of a conventional TFT.
Figure 3:
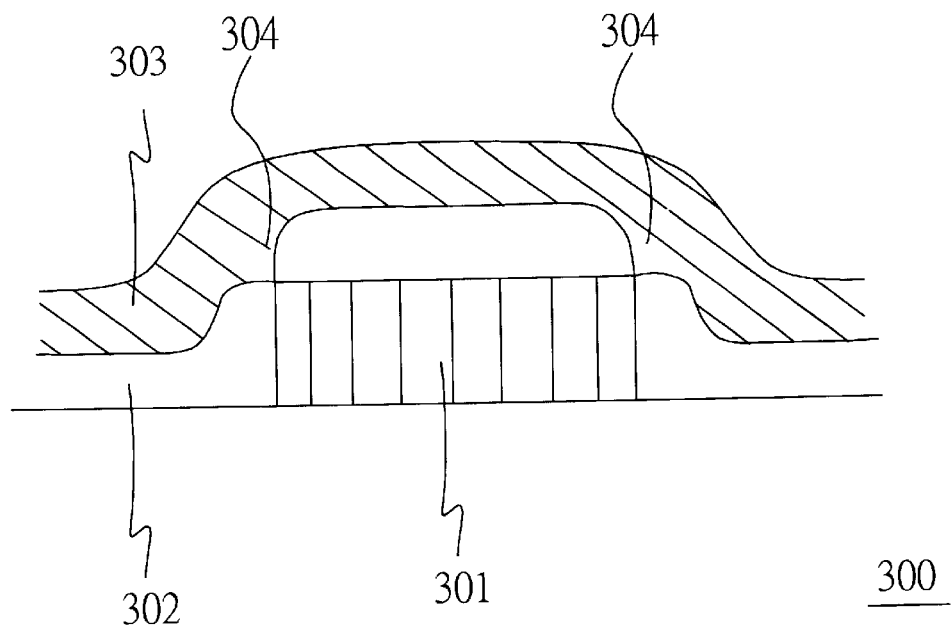
FIG. 3 (Prior Art) is a cross-sectional view of a crossover capacitor region, having pin holes, of a conventional TFT.
Figure 4:
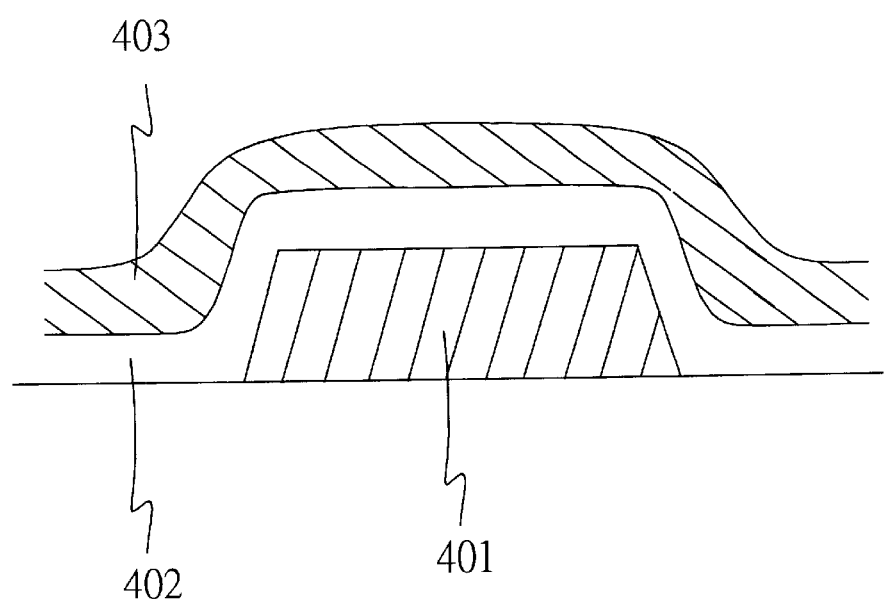
FIG. 4 (Prior Art) is the cross-sectional view, showing the conventional method to modify the TFT in order to eliminate short-circuits.
Figure 5A:
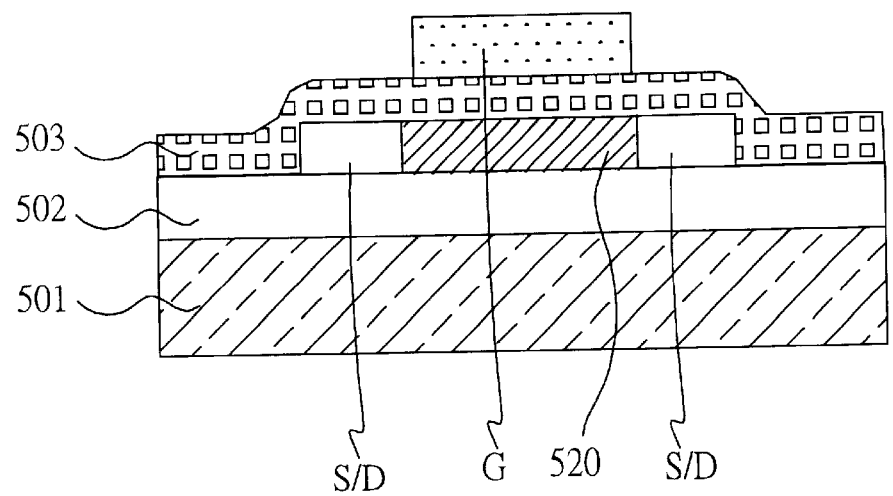
FIG. 5A to FIG. 5C are a cross-sectional views showing the fabrication of the thin film transistor (TFT) device according to a preferred embodiment of the invention.
Figure 5B:
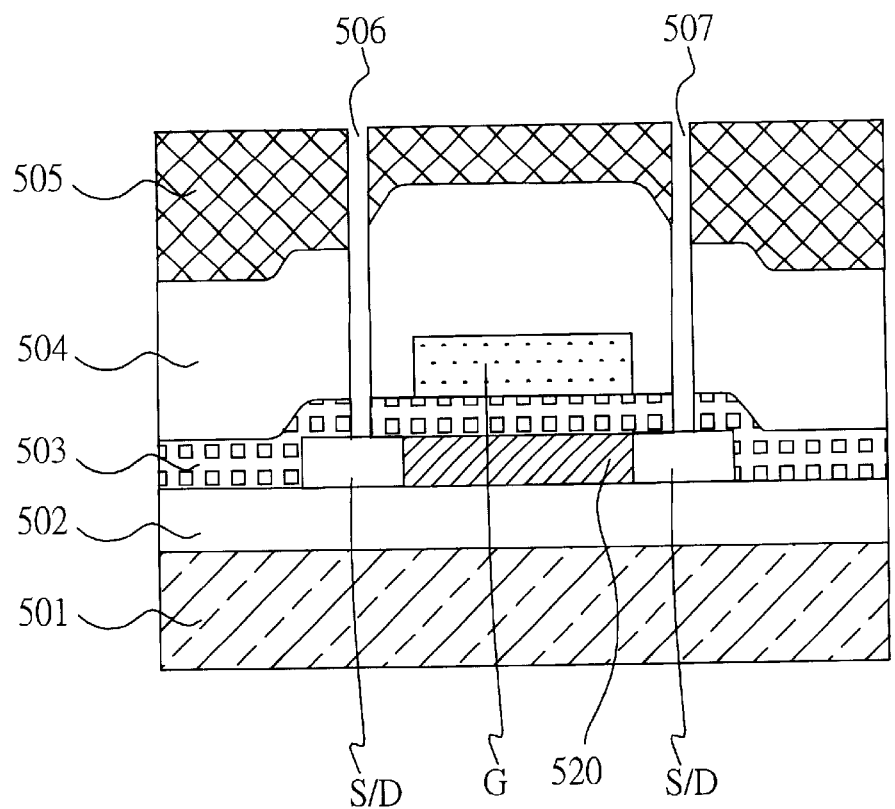
Figure 5C:
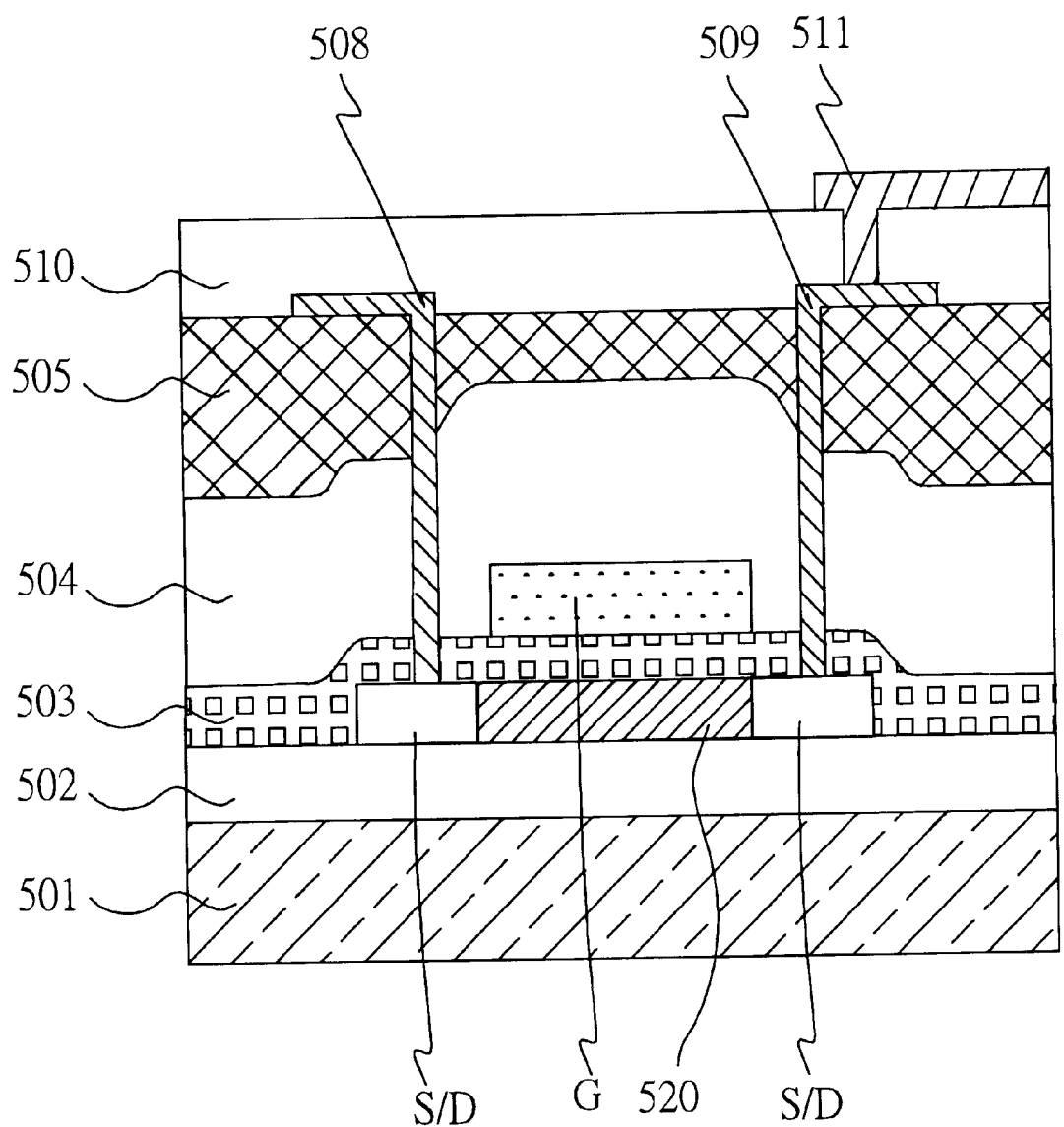

FIG. 5A to FIG. 5C are cross-sectional views showing the fabrication of the thin film transistor (TFT) device according to a preferred embodiment of the invention.

As shown in FIG. 5A, the TFT is formed on a buffer layer 502 over a substrate 501. The material of the substrate 501 could be silicon wafer material, quartz, or alkali-free glass. An active layer 520 as the channel region, and source/drain (S/D) regions of the TFT are first formed on the buffer layer 502. Next, a gate insulator 503 is formed on the buffer layer 502, preferably using Plasma Enhanced Chemical Vapor Deposition (PECVD). The gate insulator 503 covers both the S/D regions and the active layer 520. The material of the gate insulator 503 can be any kind of insulating material such as silicon oxide (SiOx) or silicon nitride (SiNx).

Then, a gate G as the scan line of the LCD panel is formed on the gate insulating layer 503 over the active layer 520. S/D regions are formed by doping the active layer 520, preferably using ion implantation. TFT with a gate G over the S/D regions as shown in FIG. 5A is the so-called Top Gate TFT.

Then, as shown in FIG. 5B, an interlayer 504 is formed over the gate insulating layer 503 and the gate G. The interlayer 504 can be formed by, for example, the following methods:

1. depositing silicon oxide (SiOx) and performing hydrogen plasma hydrogenation; or
2. depositing silicon nitride (SiNx) by PECVD and high temperature annealing.

Moreover, the interlayer 504 can be an oxide/polymer double layer structure and a single polymer layer.

Then, a planarization layer 505 is formed on the interlayer 504. The planarization layer 505 is fabricated preferably by coating polymers smoothly over the interlayer 504 using spin-on, and the preferred thickness of the planarization layer 505 is about 1–5 $\mu$m. The planarization layer 505 is one of the characteristics of the invention. The formation of the planarization layer 505 greatly reduces the occurrence of short-circuits between different metal layers and consequently increases the yield of the LCD panel.

Transparency and dielectric constant are two criteria for choosing the polymer material for the planarization layer 505. The capacitance of the crossover capacitor is a function of the value of dielectric constant of the polymer. Also, the delay time of the LCD panel is a function of the capacitance of the crossover capacitor. Therefore, the dielectric constant of the polymer determines the delay time of the LCD panel. An ideal material for LCD is a polymer having a dielectric constant of about 1.5–3.5 and high transparency. Polymers such as BCB (Dow Chemical) and PC403 (JSR) are preferred.

After the formation of the planarization layer 505, via holes 506, 507 are formed, using methods such as photolithography and etching. Via holes 506, 507 are formed down to the S/D regions. In other words, the S/D regions are exposed at this stage. Photo-resist used for forming the via holes can be either positive photo-resist or negative photo-resist.

Then, as shown in FIG. 5C, a metal layer is formed, for example, by deposition over the substrate and to fill the via holes 506, 507. The metal layer is then patterned to form metal lines 508, 509, connecting to the S/D regions.

A passivation layer 510 is next formed over the planarization layer 505, covering the metal lines 508, 509.

Then, a conductive layer 511 coupled to the metal lines 508, 509 is to be formed. The process of forming the conductive layer 511 includes: defining an opening through the passivation layer 510 to expose the metal lines 508, 509, and filling conductive material in the opening. The conductive layer 511 is used as the data line of the LCD panel. A preferred material of the conductive layer 511 can be Indium Tin Oxide (ITO).

Forming the planarization layer over the interlayer is one of the characteristics of the structure and the method of the TFT according to a preferred embodiment of the invention. The problem of short-circuits can be overcome simply by using the planarization layer instead of the conventional step of etching the lower conductive layer, that is, the scan line layer, to be taper-like.

Furthermore, the delay time of the LCD panel can be reduced by using a proper polymer material for the planarization layer.

The gate G can be designed under the data line layer to increase the aperture ratio. The occurrence ratio of short-circuits will not be affected by this design.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thin film transistor (TFT) device, comprising:
   a substrate;
   a source region over the substrate;
   a drain region over the substrate;
   an active layer over the substrate between the source region and the drain region;
   a gate insulating layer covering the source region, the drain region and the active layer;
   a gate on the gate insulating layer;
   an interlayer over the gate insulating layer, covering the gate;
   a planarization layer over the interlayer;
   a source region metal line on the planarization layer, wherein the source region metal line is connected to the source region;
   a drain region metal line on the planarization layer, wherein the drain region metal line is connected to the drain region;
   a passivation layer over the planarization layer, covering the source region metal line and the drain region metal line, wherein the gate insulating layer, the interlayer, and the planarization layer are formed between the substrate and the passivation layer; and
   a conductive layer on the passivation layer, connecting to the source region metal line.

2. The TFT of claim 1, wherein the substrate is a quartz substrate.

3. The TFT of claim 1, wherein the substrate is an alkali-free glass substrate.

4. The TFT of claim 1, further comprising:
   a buffer layer above the substrate and below the source region and drain region.

5. The TFT of claim 1, wherein the gate insulating layer is made of Silicon Oxide.

6. The TFT of claim 1, wherein the gate insulating layer is made of Silicon Nitride.

7. The TFT of claim 1, wherein the interlayer is an oxide/polymer double layer structure.

8. The TFT of claim 1, wherein the interlayer is a single polymer layer.

9. The TFT of claim 1, wherein the planarization layer is made of a polymer.

10. The TFT of claim 1, wherein the conductive layer is an Indium Tin Oxide (ITO) layer.

11. The TFT of claim 1, wherein the substrate is a silicon substrate.

12. A thin film transistor (TFT) device, comprising:

a substrate;

a source region over the substrate;

a drain region over the substrate;

an active layer over the substrate between the source region and the drain region;

a gate insulating layer formed of a gate insulating material selected from the group of materials consisting of silicon oxide and silicon nitride, the gate insulating material of the gate insulating layer covering the source region, the drain region and the active layer;

a gate on the gate insulating layer;

an interlayer made of a polymer, provided over the gate insulating layer, covering the gate;

a planarization layer over the interlayer;

a source region metal line on the planarization layer, wherein the source region metal line is connected to the source region;

a drain region metal line on the planarization layer, wherein the drain region metal line is connected to the drain region;

a passivation layer over the planarization layer, covering the source region metal line and the drain region metal line, whereby the gate insulating layer, the interlayer, and the planarization layer are formed between the substrate and the passivation layer; and a conductive layer on the passivation layer, connecting to the source region metal line.

13. The TFT of claim 12, wherein the interlayer is formed of a layer selected from the group of layers consisting of an oxide/polymer double layer structure, and a single polymer layer.

* * * * *